United States Patent [19]

Chen-Lun et al.

[11] Patent Number: 5,895,302

[45] Date of Patent: Apr. 20, 1999

[54] METHOD FOR MAKING A HEAT-RESISTANT REFLECTOR FOR LED DISPLAY SUITABLE FOR SURFACE MOUNTING

[75] Inventors: Hsing Chen Chen-Lun; Cindy Hsiao; Fu Ming-Hsi, all of Taipei Hsien, Taiwan

[73] Assignee: Lite-on Electronics, Inc., Taipei, Taiwan

[21] Appl. No.: 08/703,187

[22] Filed: Aug. 26, 1996

[30] Foreign Application Priority Data

Jun. 22, 1996 [TW] Taiwan .................................. 85107496

[51] Int. Cl.⁶ .................................................. H05B 33/20
[52] U.S. Cl. .................................................. 445/23
[58] Field of Search ........................... 445/24, 23; 264/2.6

[56] References Cited

U.S. PATENT DOCUMENTS

| 2,444,532 | 7/1948 | Richardson | 264/2.6 |
| 2,911,682 | 11/1959 | Ewald | 264/2.6 |
| 5,167,556 | 12/1992 | Stein | 445/24 |

*Primary Examiner*—Kenneth J. Ramsey
*Attorney, Agent, or Firm*—Rosenberg, Klein & Bilker

[57] ABSTRACT

Provided an LED display suitable for attaching to the printed circuit board together with other surface mounted devices by surface mounting process. This LED display may sustain the high temperature of the heating oven without the warping of the reflector. The reflector of the display is made from polycyclohexylene terephalate (PCT) and this reflector is undergone a heat treatment right after the reflector is injecting molded. By this heat treatment, the molecular connections of the plastic material become more perfect. Accordingly, the reflector is inherited with excellent stability and remains this stability during the post processes and at the high temperature of the surface mounting process.

6 Claims, 4 Drawing Sheets

METHOD FOR MAKING A HEAT-RESISTANT REFLECTOR FOR LED DISPLAY SUITABLE FOR SURFACE MOUNTING

FIELD OF THE INVENTION

This invention relates to an LED display, more particularly, to an LED display having a heat-resistant reflector which can be installed directly to the printed circuit board by surface mount technology. In particular, this LED display together with the printed circuit board can be sent to the heating oven for welding. Consequently, the conventional inserting an LED display to the printed circuit board can be conveniently eliminated. Only an additional but simple heating procedure is required to the reflector and the latter can be kept in excellent stability in all making procedures.

BACKGROUND OF THE INVENTION

Since the material and technology on electronics have a great improvement, the dimensions of the electronics and its relevant products are more and more compact to meet the market requirements. One of the key factors for this compact design is resulted from the development of the surface mount technology. During the years, a great accomplishment have been achieved that almost all the electronics and components can be kept stable and intact under the high temperature of the surface mount technology. Nevertheless, the widely used display can not be installed to the printed circuit board by surface mount technology because the reflector of the display has a poor heat-resistance. Accordingly, when the printed circuit board is to pass the heating oven, the display shall be removed firstly and re-insert to its position after the printed circuit board has been welded. Consequently, an additional making procedure is incurred.

At present, the temperature needed in the surface mounting is higher to the heat-resistance of the reflector of the display. If the display shall pass the heating oven, the heat-resistance of the reflector shall be improved, making it with high heat-resistance material which can sustain the high temperature of the heating oven. Nevertheless, even a high heat-resistance is found, another problem will be encountered, that is this heat-resistance material shall also meet the requirements set for the photo-electric components. For example, when the reflector is made from polycyclohexylene terephalate (PCT), as the display passes the heating oven, the heat of the heating oven will make the reflector deform and shrink. Consequently, the warp of the surface of the leg will bring a poor welding between the legs and the conductors of the printed circuit board.

SUMMARY OF THE INVENTION

It is the object of this invention to provide a heat treatment to the injecting molded reflector which inherits excellent stability when it is exposed to the heat of the heating oven when passes it. This stability can be kept during the later making procedures.

It is still the object of this invention to provide a heat-resistant reflector which has an excellent heat-resistance over the temperature of the heating oven. This resulted LED display together with the printed circuit board can be sent to the heating oven for welding. Consequently, the conventional inserting an LED display to the printed circuit board can be conveniently eliminated. Only an additional but simple heating procedure is required to the reflector and the latter can be kept in excellent stability in all making procedures.

In order to achieve the objects set forth, the method for making heat-resistant reflector for LED display includes the step heating the injecting molded reflector at 130–270 degrees Celsius for at least thirty minutes; cooling and curing the heated reflector to make the molecular connections of the material stably and firmly. By this arrangement, when the reflector passes the heating oven together with other electronic components to be surface mounted, its physical and chemical properties remain stably and unchanged.

BRIEF DESCRIPTION OF THE DRAWINGS

The present invention is now described by way of example only with the reference to the accompanying drawings in which.

DETAILED DESCRIPTION OF THE PREFERRED EMBODIMENT

The preferred embodiment of the present invention will be made with reference to FIGS. 2 and 4.

Figure 1:
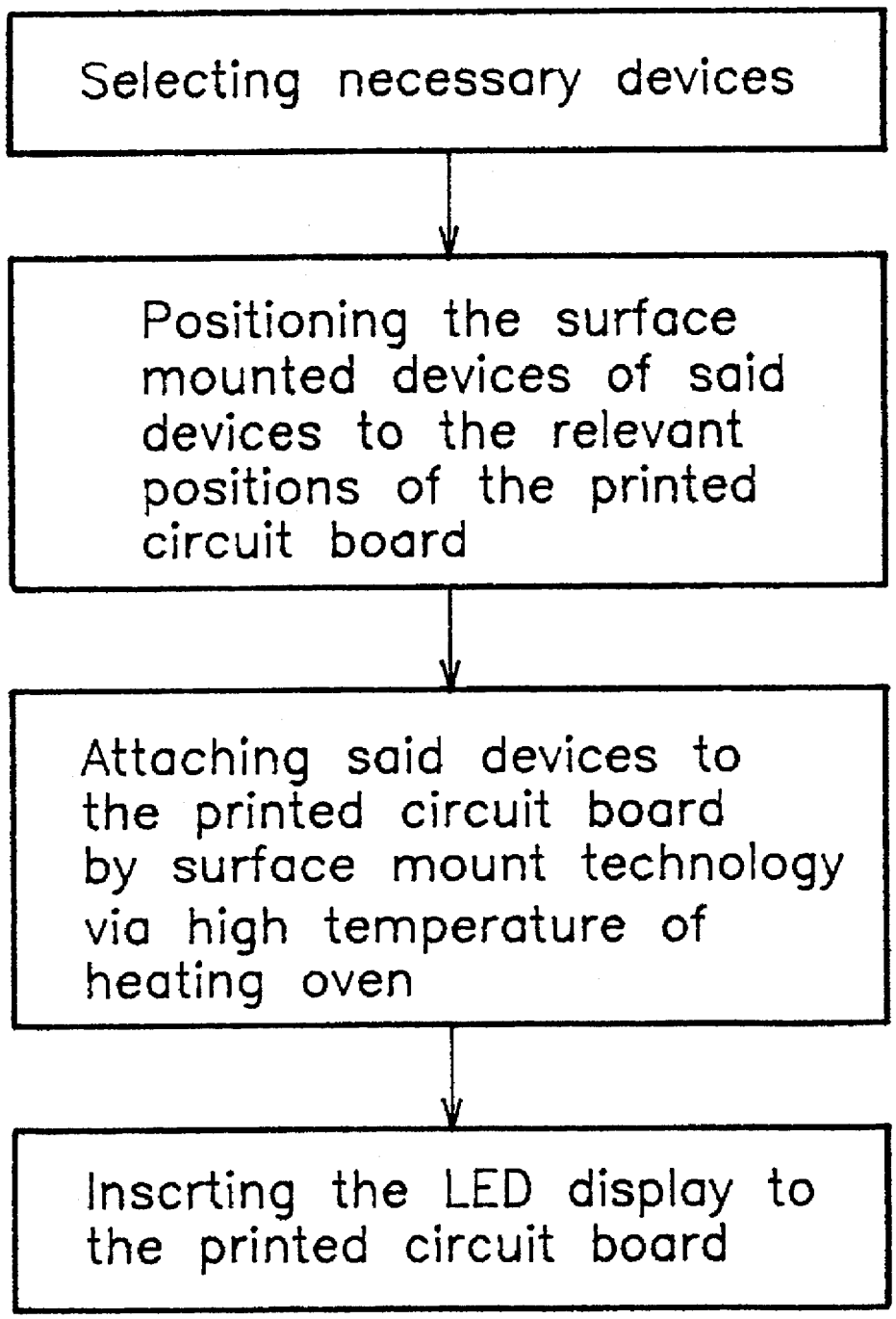
FIG. 1 is a flow-chart describing the conventional procedures of surface mounting a printed circuit board having display thereof.

Now refer to FIG. 1, a flow chart of the conventional process for installing a display to a printed circuit board via surface mount technology. Firstly, the step 11 of selecting the necessary devices to be positioned onto the printed circuit board; secondly, the step 12 of positioning each of said necessary devices to the relevant position which the device is to be attached to the printed circuit board by tin paste temporarily. The step 12 can be readily performed by automatic robot and not only by manual. Thirdly, the step 13 of sending the printed circuit board with devices thereof to the heating oven and fix all the device to the printed circuit board by surface mount technology. When all the devices are fixed to the printed circuit board and come out from the heating oven, the display is inserted to the relevant position, this is the last step 14.

From the foregoing description of the conventional procedures, it may readily understand that all the other devices which can not be attached to the printed circuit board by surface mounting can only be installed to the printed circuit board later. To the widely applied display, it is readily unsuitable to install it to the printed circuit board excluded from the surface mounting procedure, especially when the display is the only device which can not be attached to the printed circuit board by surface mounting. In light of this, heat resistance of the reflector shall be improved to solve this problem.

Figure 2:
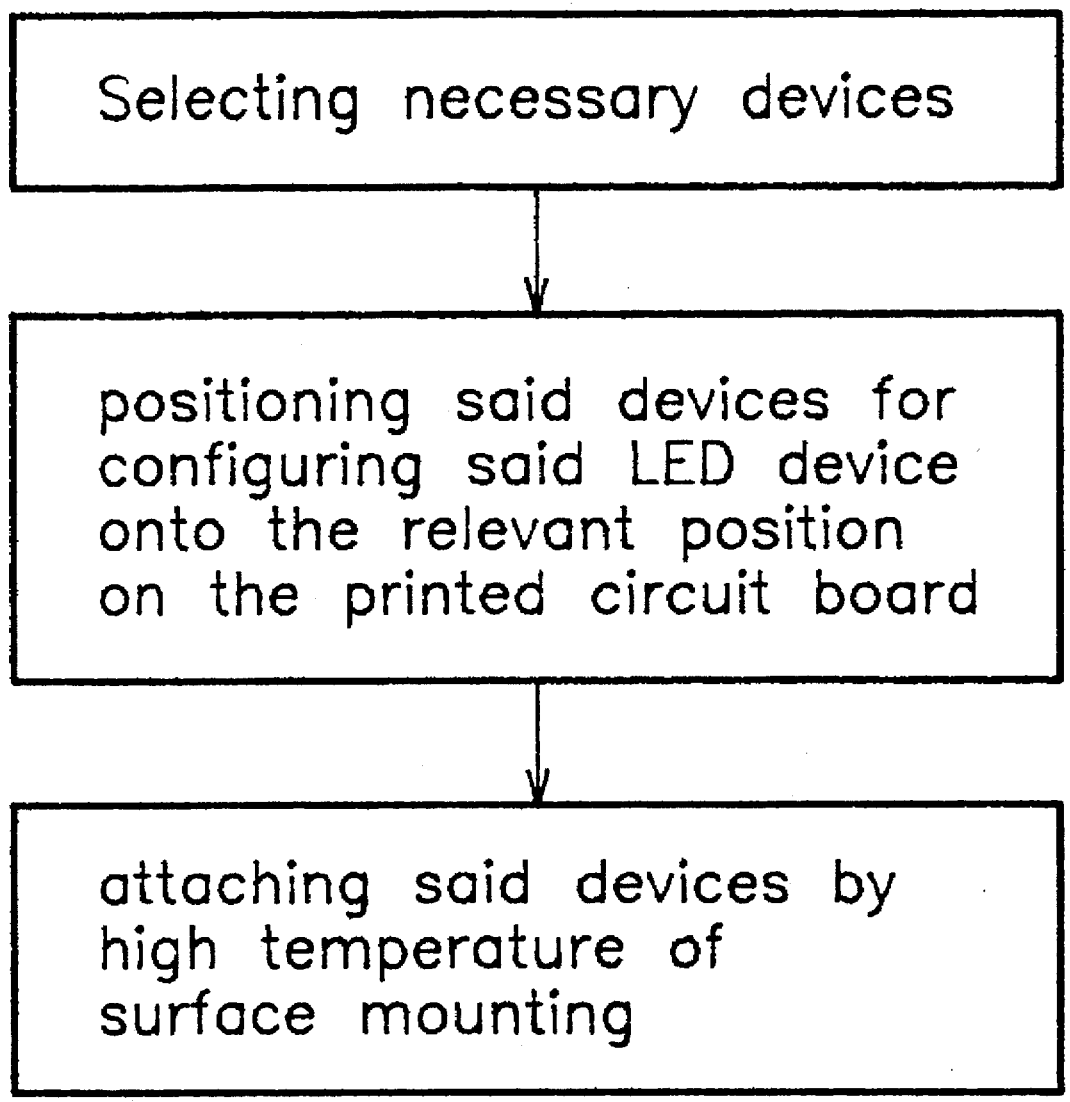
FIG. 2 is still a flow chart describing the procedures of surface mounting a printed circuit board having display thereof according to the present invention.

Referring to FIG. 2, it is a flow chart describing the procedures of surface mounting a printed circuit board having display thereof according to the present invention. The manufacturing process of the present invention includes 1) step 21 of selecting necessary devices; 2) step 22 of positioning the selected devices, including display, to the relevant positions of the printed circuit board; and step 23 of attaching all the devices to the printed circuit board by surface mount technology. From the foregoing teaching, it may readily understand that the display can be attached to the printed circuit board by the surface mount technology, accordingly, the step of inserting the display to the printed circuit board is conveniently eliminated. The manufacturing process is simplified.

Figure 3:
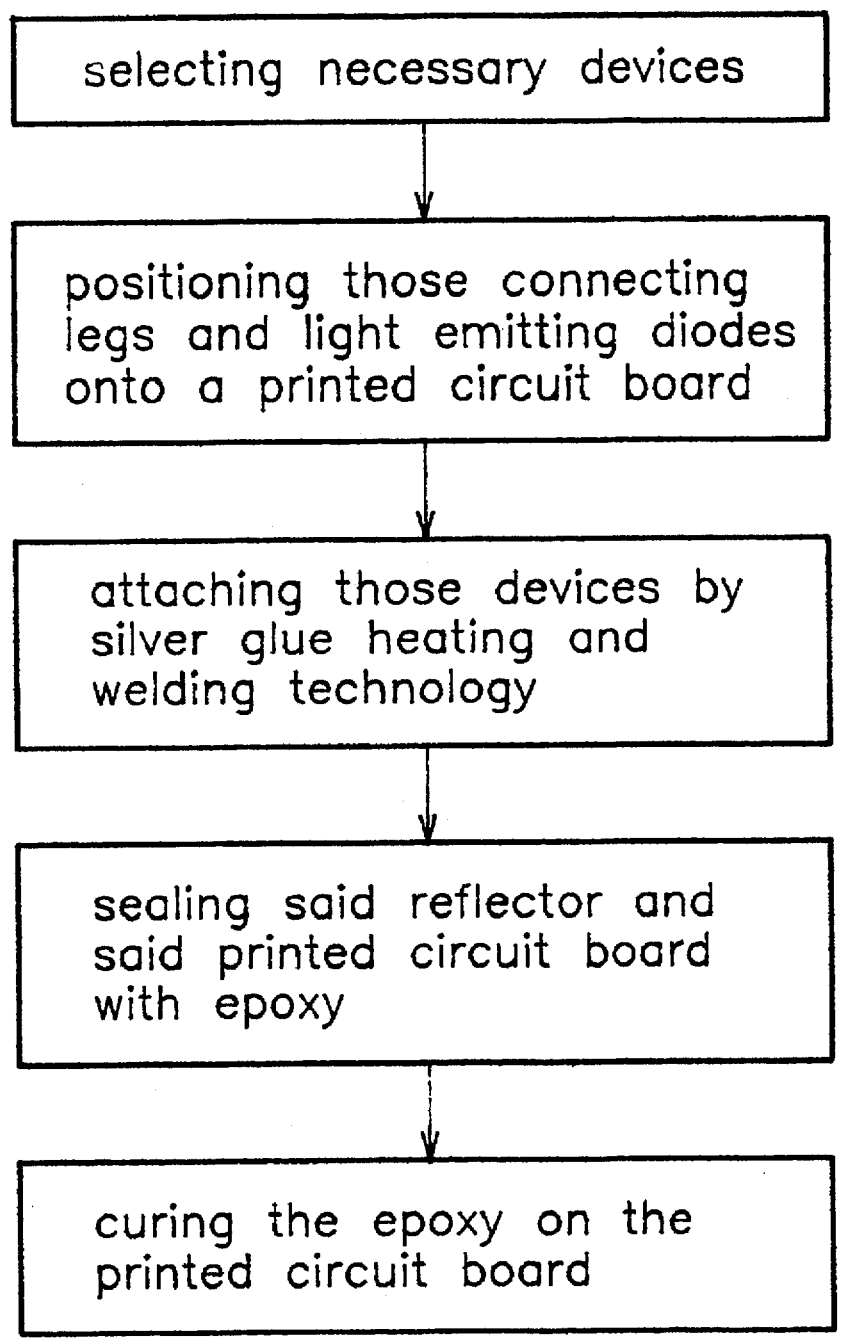
FIG. 3 is still a flow chart describing the conventional processes of making a reflector for display.

Referring to FIG. 3, it describes the conventional processes of making a reflector for display. Firstly, the step 31 includes selecting necessary devices which include a reflector, a plurality of connecting legs, a printed circuit board and a plurality of light emitting diodes. Then the step 32 of positioning each of those devices to the relevant position on the printed circuit board temporary by means of silver glue. Afterward, the step 33 of applying the technology of heating silver glue and welding to connect the silver glue with the device disposed thereupon. Then the step 34 of sealing the reflector and the printed circuit board by epoxy to form the display. At last, the step 35 of curing the display with preset temperature to complete the manufacture of the display.

In the conventional manufacturing process, the reflector is made from polycyclohetxylene terephalate (PUCT) by injecting molded. The thermoplastic temperature of this material is 270 degrees Celsius and the sealant is epoxy. These two material have higher heat resistance. However, if the reflector made therefrom is not properly treated the reflector will experience warp, deform when it is passed to the heating oven. These deformation will render it unworkable by means of welding.

When the reflector is examined by the Differential Scanning Calorimeter, it is found that the material of the reflector will experience a re-construction of their molecular chains at 130 degrees Celsius and the material of the reflector shall experience this temperature before it is treated by the heating oven of the surface mounting procedures. It is found by the inventor that when the material for the reflector is undergone a heat treatment after the reflector is injecting molded at the temperature ranges from 130–270 degrees Celsius about thirty (30) minutes, the resulted reflector will be inherited with an excellent physical stability. This stability can be remained perfectly during the painting, gluing and even during the reheating. A lot of experimental data will be provided to support this conclusion.

Figure 4:
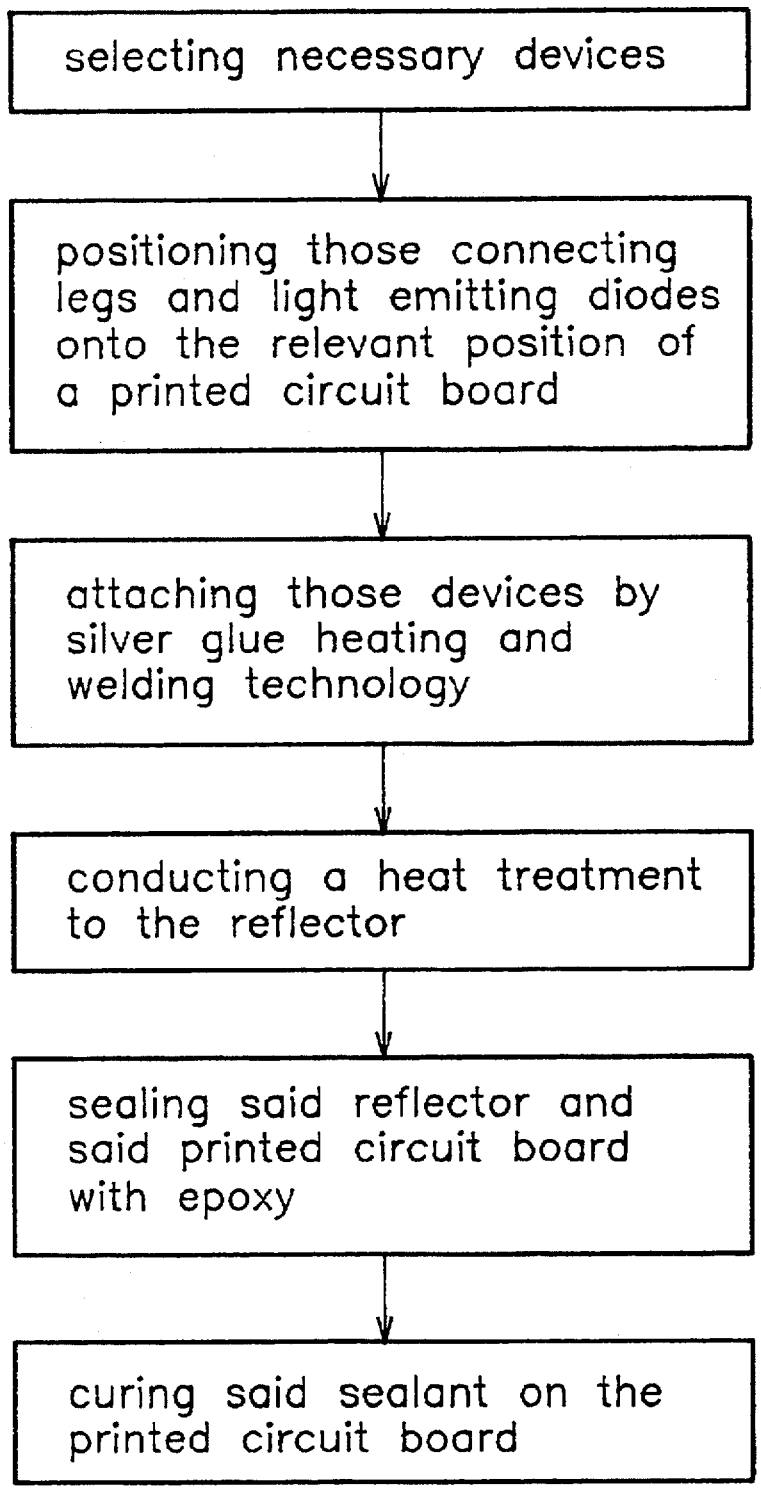
FIG. 4 is still a flow chart describing an additional heat treatment process to stabilize the reflector.

FIG. 4 is a flow chart describing the additional heat treatment process to stabilize the reflector and the problems which the prior art encountered will be completely solved.

The process includes the following steps, 1) the step 41 of selecting necessary devices which includes a reflector, a plurality of connecting legs, a printed circuit board, and a plurality of light emitting diodes. Then, the step 42 of positioning said devices to the suitable position on the printed circuit board. Then the step 43 of attaching said devices to the printed circuit board by heating silver glue and welding to complete the assembling. Afterward, the step 44 of heating the reflector at temperature of 130–270 degrees Celsius about thirty (30) minutes and cools it. At last, the step 45 of scaling the reflector and the printed circuit board with epoxy and at last, the step 46 of curing the epoxy disposed to the reflector and printed circuit board. It is found that the display made from the process disclosed in FIG. 4 can be used as device which can be attached to the printed circuit board directly by means of surface mount technology as other electronics.

When the material of reflector is undergone the additional heat treatment right after it is injecting molded, the reflector will inherit excellent heat-resistant property which prevents it from deforming and warping when it is exposed to the high temperature of heating oven. This excellent physical property is proved by the experiments and their results are listed in Table 1 and 2 which show the warping conditions of the reflectors in painting, gluing and during the surface mounting process respectively, wherein sample in Table 1 is prior art and sample in Table 2 has undergone the additional heat treatment. Painting is used to being an aesthetic appearance to the reflector. Gluing is to seal the reflector and printed circuit board with epoxy to form a display. Surface mounting is to expose the display and printed circuit board with high temperature to melt the silver glue and attach the display to the printed circuit board. Table 3 discloses the influence to the reflector under different heating conditions. The sample is taken from the present invention has undergone the heat treatment at temperature 130–270 degrees about thirty (30) minutes.

Table 1 discloses the warping conditions of a reflector of conventional display when it undergoes the painting, gluing and SMT processes.

TABLE 1

Reflector of Prior Art

| Test conditions | Before painting | After painting | After gluing | After SMT |
| --- | --- | --- | --- | --- |
| Warping | 0.12 mm | 0.31 mm | 0.28 mm | 0.36 mm |

Table 2 discloses the warping conditions of a reflector of display made according to this invention when it undergoes the painting, gluing and SNT processes. Apparently, the warping condition has been largely improved.

TABLE 2

Reflector of the Invention

| Test conditions | Before painting | After painting | After gluing | After SMT |
| --- | --- | --- | --- | --- |
| Warping | 0.130 mm | 0.130 mm | 0.156 mm | 0.159 mm |

Table discloses the reheating conditions of the reflector made according to this invention. Apparently, when the reflector is firstly heat-treated, even it undergoes a secondary or thirdly heat treatment the warping is still trivial.

TABLE 3

Reheating test of the reflector of the invention

| Heating Conditions | 180° C./1 hr (heat treatment) | 100° C./1 hr (drying after painting) | 180° C./1 hr (SMT process) |
| --- | --- | --- | --- |
| Warping | 0.201 mm | 0.200 mm | 0.200 mm |

With the comparison made in Tables 1, 2 and 3, it may readily understood that when the material of reflector is undergone a heat treatment right after the reflector is injecting molded, the reflector may be inherited with excellent stability which extends to painting, gluing and SMT processes. By this arrangement, the warping level is largely reduced to a certain low level which make the display made according to this invention can be installed to the printed circuit board directly by the SMT process. During the heat treatment to the reflector, the material really undergoes a molecular re-construction which make the material more and more stable. In light of this, the conventional warping problem of the display can be completely solved by the provision of the present invention.

The invention has been described with reference to preferred embodiment. Obviously, modifications and alterations will occur to others upon the reading and understanding of the specification. It is intended to include all such modifications and alternations insofar as they come with the scope of the appended claims or the equivalents thereof.

We claim:

1. A method of attaching an LED display directly to a printed circuit board by means of surface mount technology, comprising the steps of:
   a. selecting a plurality of necessary devices for configuring an LED display device and a printed circuit board, said plurality of necessary devices including a reflector, a plurality of connecting legs, and a plurality of light emitting diodes;
   b. positioning said plurality of necessary devices on said printed circuit board; and,
   c. attaching said plurality of necessary devices to said circuit board by surface mount technology, said reflector being treated with a heat treatment at a temperature of 130–270° C. for thirty (30) minutes followed by cooling.

2. A method for making, LED dislay suitable for surface mounting, comprising the steps of:
   1) selecting necessary devices which includes a reflector, a plurality of connecting legs, a plurality of light emitting diodes, and a sealant;
   2) assembling said plurality of connecting legs and light emitting diodes onto a printed circuit board;
   3) attaching said plurality of connecting legs and light emitting diodes onto said printed circuit board by surface mounting;
   4) conducting a heat treatment to said reflector;
   5) sealing said reflector and said printed circuit board by said sealant; and
   6) curing said sealant.

3. The method as recited in claim 2, wherein said heat treatment is conducted at a temperature of 130–270° C. for at least thirty (30) minutes prior to cooling said reflector.

4. The method as recited in claim 2, wherein said reflector is made from polycyclohexylene terephalate (PCT).

5. The method as recited in claim 2 wherein said sealant is epoxy.

6. An LED display device which is made from the process recited in claim 2 or claim 3.

* * * * *